United States Patent
Tan et al.

[11] Patent Number: 6,150,278
[45] Date of Patent: Nov. 21, 2000

[54] METHOD OF FABRICATING NODE CAPACITOR FOR DRAM PROCESSES

[75] Inventors: Wayne Tan, Taipei; Kun-Chi Lin, Hsin-Chu, both of Taiwan

[73] Assignee: United Microelectronics Corp., Hsin-Chu, Taiwan

[21] Appl. No.: 09/357,236

[22] Filed: Jul. 20, 1999

[51] Int. Cl.$^7$ ................................................ H01L 21/8242
[52] U.S. Cl. .................... 438/706; 438/710; 438/712; 438/719
[58] Field of Search ..................... 438/706, 710, 438/712, 243, 244, 255, 254, 256, 396, 595, 672, 675; 257/296, 392, 369

[56] References Cited

U.S. PATENT DOCUMENTS

| | | | |
|---|---|---|---|
| 5,710,073 | 1/1998 | Jeng et al. | 438/239 |
| 5,716,881 | 2/1998 | Liang et al. | 438/238 |
| 5,770,500 | 6/1998 | Bartra et al. | 438/255 |
| 5,792,687 | 8/1998 | Jeng et al. | 438/253 |
| 5,798,280 | 8/1998 | Mathew et al. | 438/565 |
| 5,895,239 | 4/1999 | Jeng et al. | 438/239 |

*Primary Examiner*—Benjamin L. Utech
*Assistant Examiner*—Lan Vinh

[57] ABSTRACT

An improved method of fabricating a node capacitor for a dynamic random access memory (DRAM) process is disclosed. The process includes depositing a first interpoly dielectric (IPD1) layer over a substrate, patterning a first photoresist layer on the first interpoly dielectric layer, thereby defining a trench. A trench is etched in the first interpoly dielectric layer using the first photoresist layer as a mask. A first polysilicon layer is deposited on the first interpoly dielectric layer. The first polysilicon layer is etched to expose the first interpoly dielectric layer, then forming a landing pad over the substrate. In order to a polycide layer and a second interpoly dielectric (IPD2) layer are deposited, patterning a second photoresist layer, thereby defining a bit line structure. A bit line structure is formed, then depositing a spacer on the bit line structure. A second polysilicon layer is deposited, patterning a third photoresist layer, thereby defining a bottom electrode. A bottom electrode is formed, then depositing a thin NO (silicon nitride-silicon oxide) dielectric layer on the bottom electrode. An addition step is performed before forming the thin NO dielectric layer on the bottom electrode. In this additional step, a hemispherical grain (HSG) polysilicon layer is formed on the second polysilicon layer. This advantage is used to the hemispherical grain polysilicon layer increasing the area of a node capacitor. A third polysilicon layer is deposited completely covering the thin NO dielectric layer to form a top electrode.

26 Claims, 4 Drawing Sheets

METHOD OF FABRICATING NODE CAPACITOR FOR DRAM PROCESSES

BACKGROUND OF THE INVENTION

1. Field of the Invention

The present invention relates to a method of fabricating a dynamic random access memory (DRAM), and particularly to a method of fabricating node capacitor for DRAM processes.

2. Description of the Prior Art

Recently, demand for semiconductor devices has rapidly increased owing to widespread use of electronic equipment. In particular, the increasing popularity of some electronic equipment such as computers, for example, is increasing the demand for large semiconductor memories. One approach for increasing capacitance while maintaining the high integration of the storage cells is directed toward the shape of the capacitor electrodes. In this approach, the polysilicon layer implementing a capacitor electrode may have protrusions, fins, cavities, etc., to increase the electrode's surface area, thereby increasing the capacitor's capacitance while maintaining the small area occupied by the capacitor on the substrate surface. Consequently, this type of capacitor has come to be widely used in DRAM devices.

In another approach, a hemispherical grain (HSG) technique is used to increase the surface area of the capacitor electrode. FIG. 2 shows the cross section of a traditional DRAM capacitor fabricated using a hemispherical grain (HSG) technique. A hemispherical grain polysilicon layer 210 is deposited on a doped polysilicon storage node 200. Thus, the topography of the hemispherical grain polysilicon layer 210 is transferred to the top surface of the doped polysilicon storage node 200, forming a bottom electrode, as shown in FIG. 2. Although this DRAM capacitor has some increase in electrode surface area resulting from the rugged surface of the doped polysilicon storage node 200, further increases in electrode surface area are still desirable.

SUMMARY OF THE INVENTION

In accordance with the present invention, a method is provided for forming a dynamic random access memory (DRAM) capacitor that substantially increases capacitance. In one embodiment, a first interpoly dielectric (IPD1) layer is deposited over a substrate, and then a first photoresist layer is patterned on the first interpoly dielectric layer to define a trench. A portion of the first interpoly dielectric layer is removed using the first photoresist layer as a mask. Thus the trench is formed in the first interpoly dielectric layer. Afterwards, the first polysilicon layer is deposited on the first interpoly dielectric layer, filling the trench in the first interpoly dielectric layer. A landing pad is formed over the substrate. In order to a polycide layer and a second interpoly dielectric (IPD2) layer are deposited, patterning a second photoresist layer, thereby defining a bit line structure. Portions of the polycide layer and the second interpoly dielectric layer are removed, using the second photoresist layer as a mask, exposing portions of the first interpoly dielectric layer and forming a bit line structure, then depositing a spacer on the bit line structure sidewall. Next, a second polysilicon layer is deposited, patterning a third photoresist layer, thereby defining a bottom electrode. A portion of the second polysilicon layer is removed, using the third photoresist layer as a mask, exposing portions of the bit line structure and the spacer and portions of the first interpoly dielectric layer, forming a bottom electrode, then depositing a thin NO (silicon nitride-silicon oxide) dielectric layer on the bottom electrode. Afterwards, a third polysilicon layer is deposited completely covering the thin NO dielectric layer to form a top electrode.

In another embodiment, an additional step is performed before forming the thin NO dielectric layer on the bottom electrode. In this additional step, a hemispherical grain (HSG) polysilicon layer is formed on the bottom electrode. This embodiment is advantageously used to the hemispherical grain polysilicon layer increasing the area of a node capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 3A, 3B, 3C, 3D, 3E, 3F, 3G, and 3I show the cross-sectional views illustrative of various stages in the fabrication of a DRAM capacitor in accordance with another embodiment of the present invention.

DESCRIPTION OF THE PREFERRED EMBODIMENT

Figure 1:
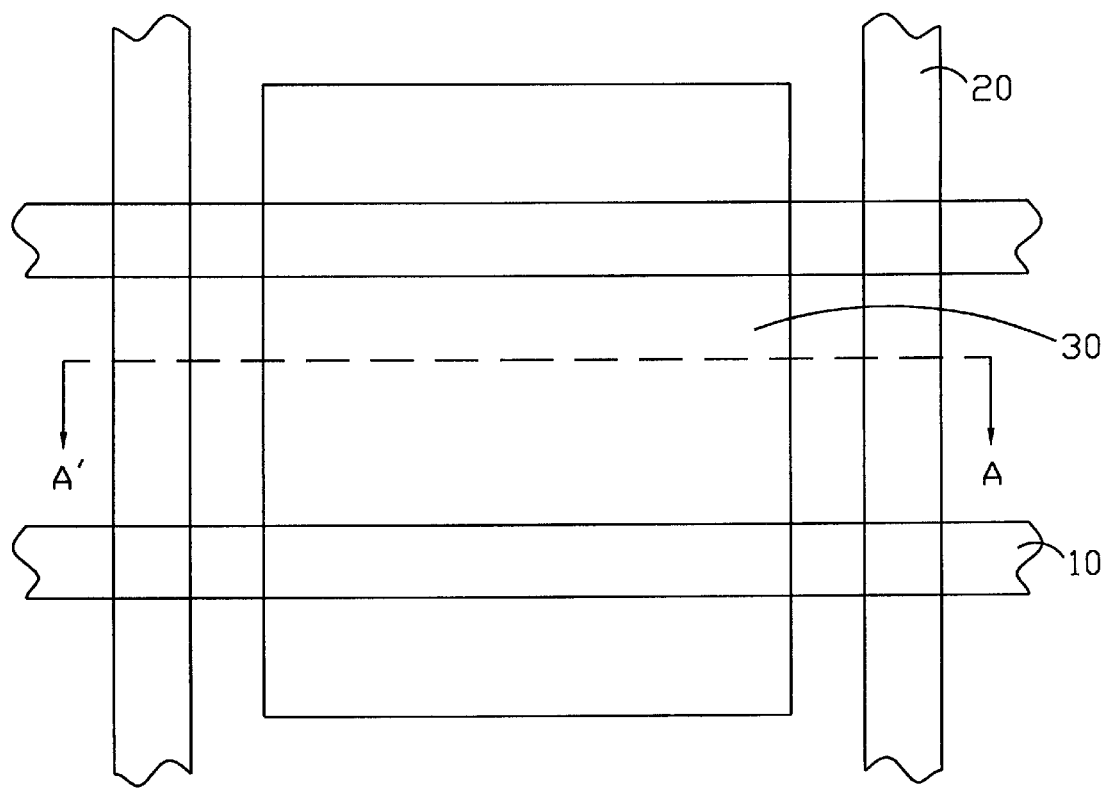
FIG. 1 shows the top view of a dynamic random access memory (DRAM) cell.
Figure 2:
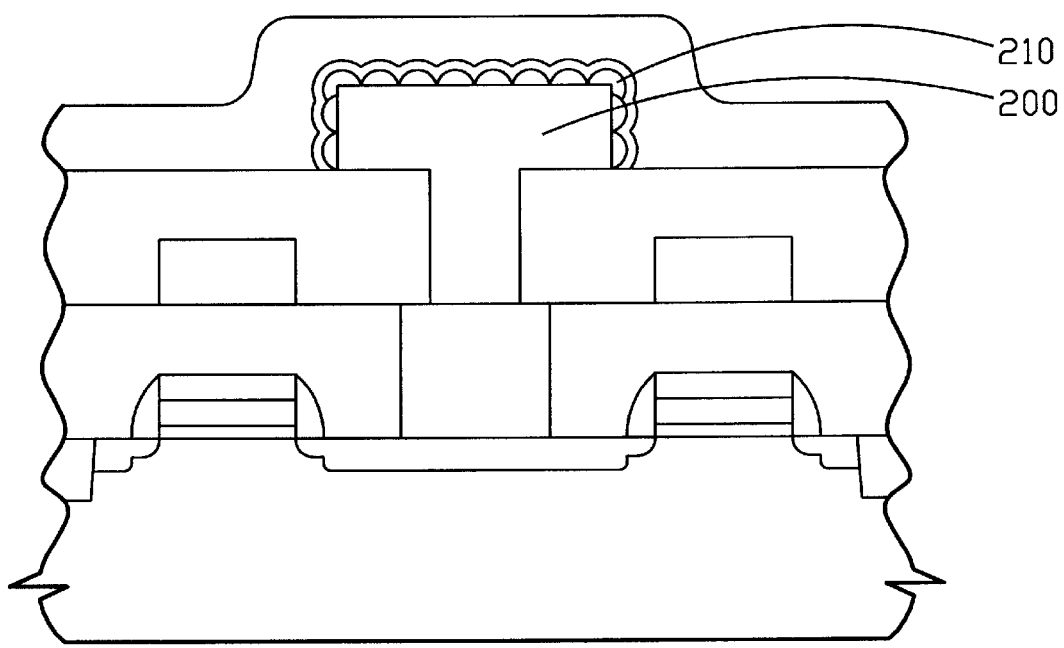
FIG. 2 shows the cross section of a traditional DRAM capacitor fabricated using a hemispherical grain (HSG) technique.

A method of fabricating a node capacitor for a DRAM cell will now be described in detail. Referring to FIG. 1 shows the top view of a dynamic random access memory (DRAM) cell. Word lines 10 and bit lines 20, fabricated as polysilicon gate structures, are shown under a node capacitor 30.

Figure 3A:
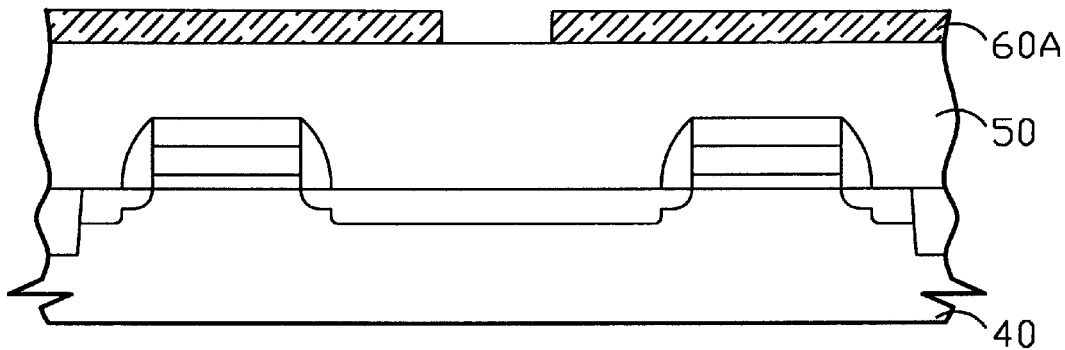
FIGS. 3A, 3B, 3C, 3D, 3E, 3F, 3G, and 3H show the cross-sectional views illustrative of various stages in the fabrication of a DRAM capacitor in accordance with one embodiment of the present invention.
Figure 3B:
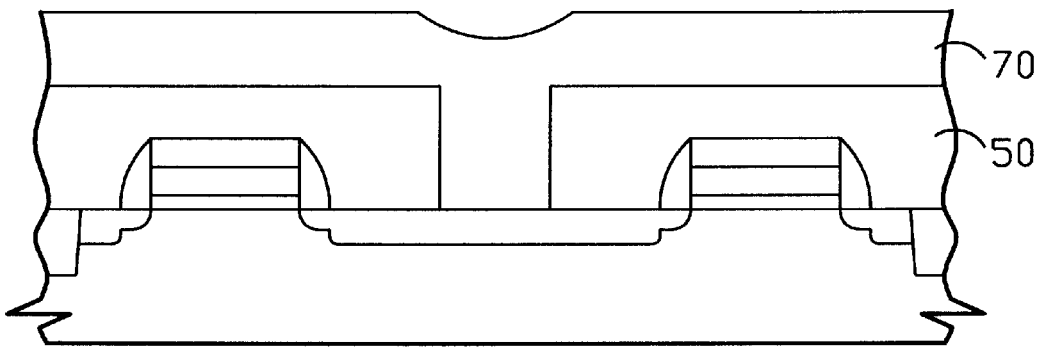
Figure 3C:
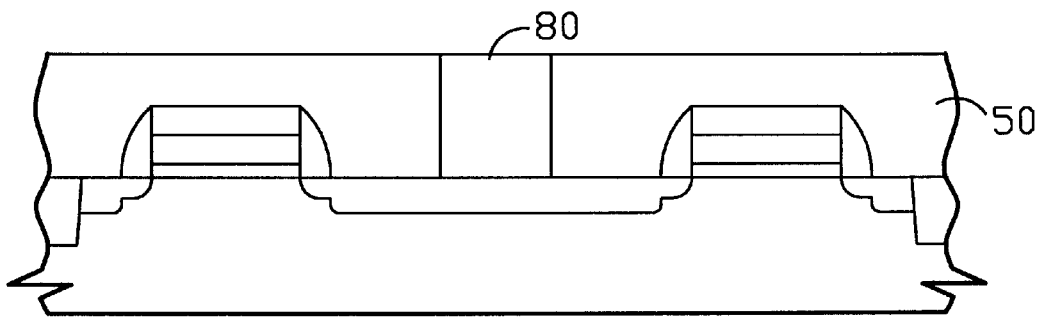
Figure 3D:
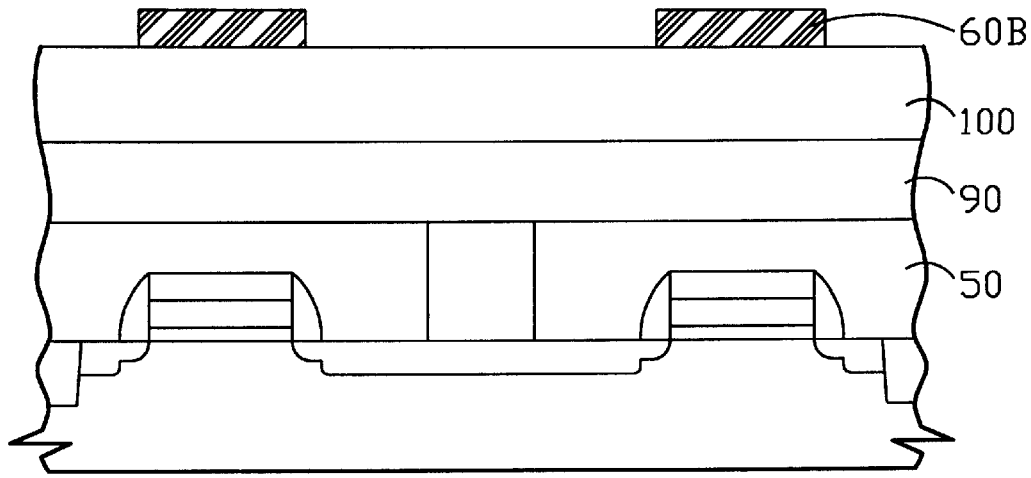
Figure 3E:
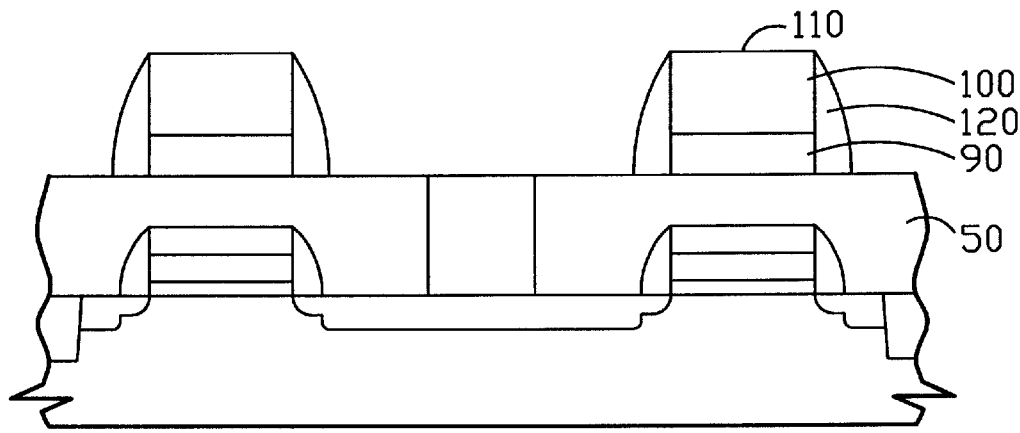
Figure 3F:
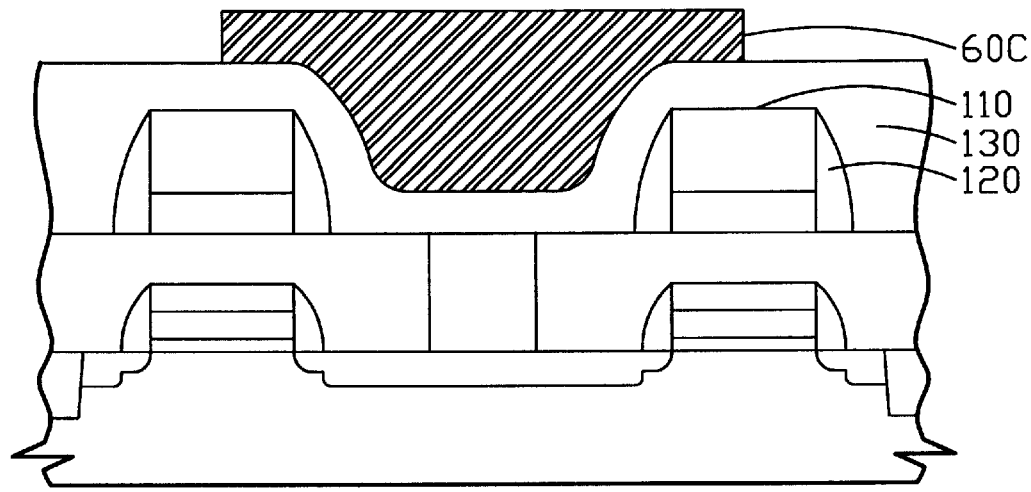
Figure 3G:
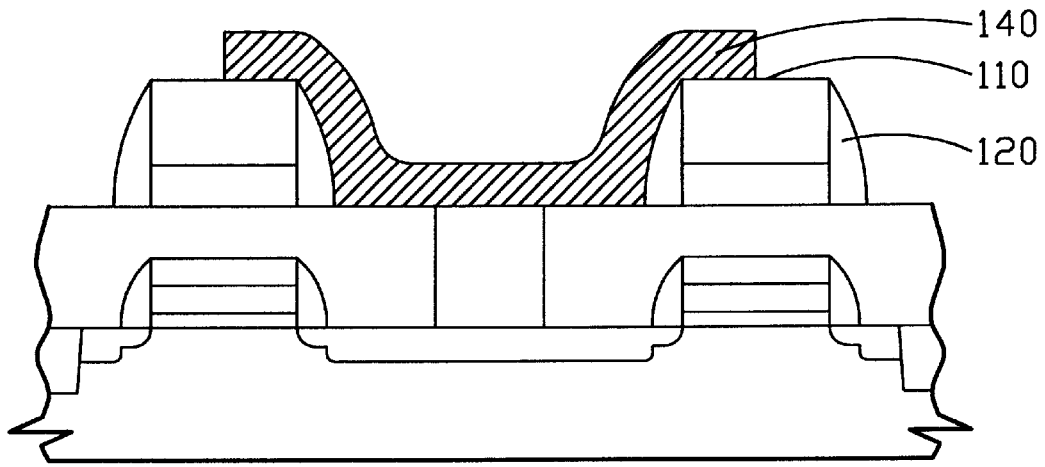

Referring to FIGS. 3A to 3G, a metal-oxide-semiconductor field effect transistor (MOSFET) is formed in and on semiconductor substrate 40. At first, a first interpoly dielectric (IPD1) layer 50 is deposited using low pressure chemical vapor deposition (LPCVD) procedures and tetra-ethylorthosilicate (TEOS) as a source, at a temperature between about 500.degree. to 800.degree. C., to a thickness between about 1000 to 3000 angstroms, over a substrate 40. A first photoresist layer 60A is patterned using conventional photolithography on the first interpoly dielectric layer 50 to define a trench, as shown in FIG. 3A. Referring to FIG. 3B, a portion of the first interpoly dielectric layer 50 is removed using reactive ion etching (RIE) with CF.sub.4 as an etchant, to create a trench. Afterwards, a first polysilicon layer 70 is deposited, using LPCVD procedures at a temperature between about 600.degree. to 650.degree. C., on the first interpoly dielectric layer 50, filling the trench in the first interpoly dielectric layer 50. Referring to FIG. 3C, the first polysilicon layer 70 is etched back, using chemical mechanical polishing (CMP) or RIE procedures, to achieve a landing pad 80 over the substrate 40. Next, referring to FIG. 3D, a polycide layer 90 is deposited, including polysillicon and tungsten silicon (WSi.sub.2), using conventional fabrication over first interpoly dielectric layer 50 and the landing pad 80. A second interpoly dielectric (IPD2) layer 100 is deposited using LPCVD procedures and TEOS as a source, at a temperature between about 500.degree. to 800.degree. C., to a thickness between about 1000 to 3000 angstroms, over the first interpoly dielectric layer 50. A second photoresist layer 60B is patterned using conventional photolithography on the second interpoly dielectric layer 100 to define a bit line structure 110. Referring to FIG. 3E, portions of the polycide layer 90 and the second interpoly dielectric layer 100 are removed, using anisotropic RIE procedure, exposing portions of the first interpoly dielectric layer 50 and forming a bit line structure 110. Then an oxide spacer 120 is deposited, using either LPCVD or PECVD procedures, and etching back, to a thickness between about 1000 angstroms, on the bit line structure 110 sidewall. Referring to FIG. 3F, a second polysilicon layer 130 is deposited, using LPCVD procedures at a temperature between about 600.degree. to 650.degree. C., over the first interpoly dielectric layer 50, the bit line structure 110, and the oxide spacer 120. Afterwards, a third photoresist layer 60C is patterned using conventional photolithography on the second polysilicon layer 130 to define a bottom electrode 140. A portion of the second polysilicon layer is removed, using anisotropic RIE procedure with $Cl_2$ as an etchant, to achieve a bottom electrode 140, exposing a portion of the bit line structure 110, a portion of the oxide spacer 120 and a portion of the first interpoly dielectric layer 50, as shown in FIG. 3G.

Figure 3H:
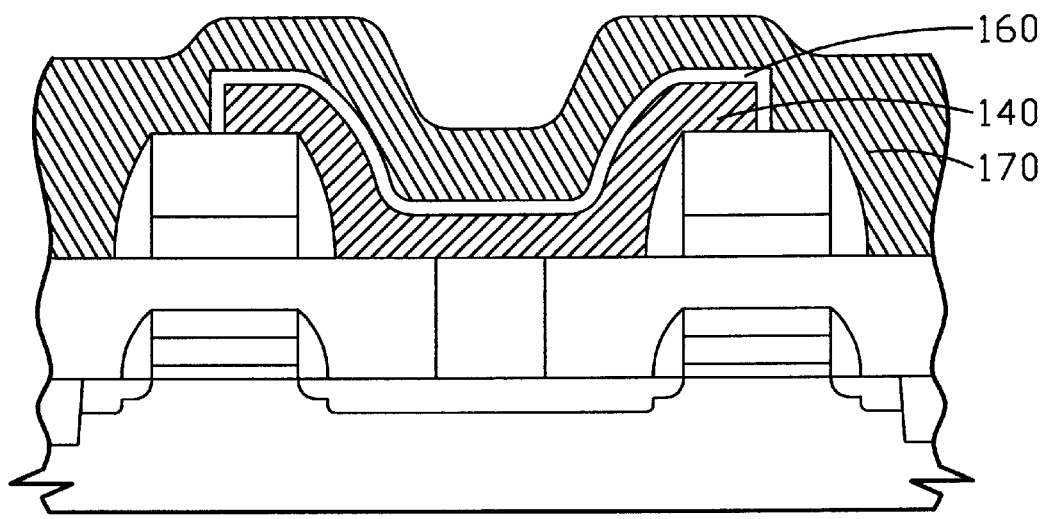

Referring to FIG. 3H, a thin NO (silicon nitride-silicon oxide) dielectric layer 160 is deposited, using either LPCVD or PECVD procedures, on the bottom electrode 140. Afterwards, a third polysilicon layer 170 is deposited, using LPCVD procedures at a temperature between about 600.degree. to 650.degree. C., completely covering the thin NO dielectric layer 160 to form a top electrode 170.

Figure 3I:
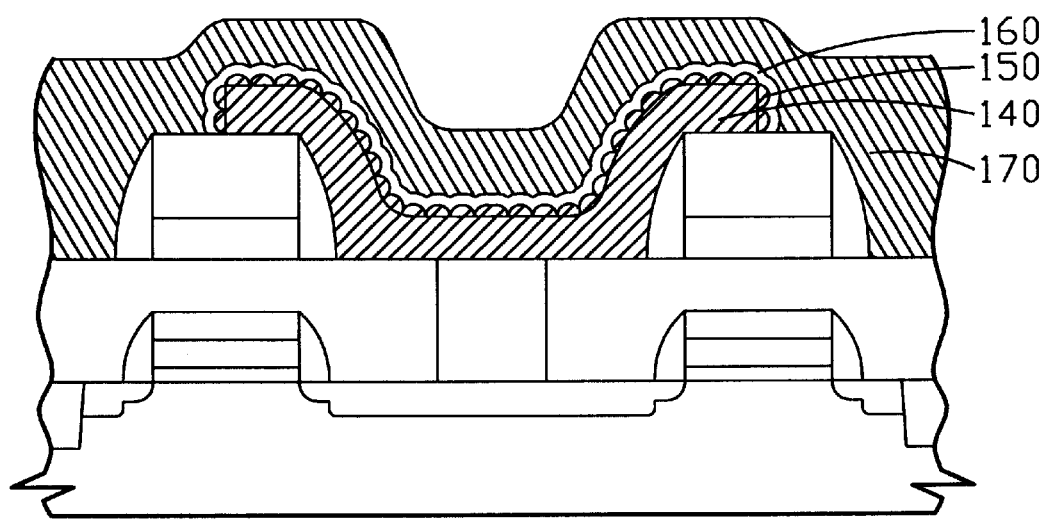

Referring to FIG. 3I, an additional step is performed before forming the thin NO dielectric layer 160 on the bottom electrode 140. In this additional step, a hemispherical grain (HSG) polysilicon layer 150 is formed on the bottom electrode 140. This is advantageously used to the hemispherical grain polysilicon layer increasing the area of a node capacitor.

Although specific embodiments have been illustrated and described, it will be obvious to those skilled in the art that various modifications may be made without departing from the spirit which is intended to be limited solely by the appended claims.

What is claimed is:

1. A method of fabricating a node capacitor for a dynamic random access memory (DRAM) cell, on a semiconductor substrate, said node capacitor comprising:

forming a first interpoly dielectric (IPD1) layer over said semiconductor substrate;

forming a first photoresist layer on said first interpoly dielectric layer, said first photoresist layer defining a trench;

removing a portion of said first interpoly dielectric layer using said first photoresist layer as a mask, thereby forming said trench in said first interpoly dielectric layer;

removing said first photoresist layer;

depositing a first polysilicon layer on said first interpoly dielectric layer, said first polysilicon layer filling said trench in said first interpoly dielectric layer;

etching said first polysilicon layer to expose said first interpoly dielectric layer;

forming a landing pad over said semiconductor substrate;

depositing a polycide layer on said first interpoly layer and said landing pad;

depositing a second interpoly dielectric (IPD2) layer on said polycide layer;

forming a second photoresist layer on said second interpoly dielectric layer, said second photoresist layer defining a bit line structure;

removing a portion of said second interpoly dielectric layer and a portion of said polycide layer using said second photoresist layer as a mask, thereby forming said bit line structure on said first interpoly dielectric layer;

removing said second photoresist layer;

forming a spacer on said bit line structure;

depositing a second polysilicon layer on said first interpoly dielectric layer, said spacer, and said bit line structure;

forming a third photoresist layer on said second polysilicon layer, said third photoresist layer defining a bottom electrode;

removing a portion of said second polysilicon layer using said third photoresist layer as a mask, thereby forming said bottom electrode;

removing said third photoresist layer;

forming a thin dielectric layer on said bottom electrode; and depositing a third polysilicon layer to form a top electrode, completely covering said thin dielectric layer.

2. A method according to claim 1, wherein said semiconductor substrate comprises a metal-oxide-semiconductor field effect transistor (MOSFET) formed in and on the substrate, said metal-oxide-semiconductor field effect transistor being a part of said dynamic random access memory cell.

3. A method according to claim 1, wherein said first interpoly dielectric (IPD1) layer comprises a first silicon oxide, using low pressure chemical vapor deposition (LPCVD) procedures and tetraethylorthosilicate (TEOS) as a source, at a temperature between about 500.degree. to 800.degree. C., to a thickness between about 1000 to 3000 angstroms, over said semiconductor substrate.

4. A method according to claim 1, wherein said first interpoly dielectric layer is removed using reactive ion etching (RIE) with $CF_4$ as an etchant.

5. A method according to claim 1, wherein said first polysilicon layer is deposited, using LPCVD procedures at a temperature between about 600.degree. to 650.degree. C.

6. A method according to claim 1, wherein said landing pad is formed using chemical mechanical polishing (CMP) to etch back said first polysilicon layer.

7. A method according to claim 1, wherein said landing pad is formed using RIE procedures to etch back said first polysilicon layer.

8. A method according to claim 1, wherein said polycide layer comprises polysilicon and tungsten silicon ($WSi_2$).

9. A method according to claim 1, wherein said second interpoly dielectric (IPD2) layer comprises a second silicon oxide, using LPCVD procedures and TEOS as a source, at a temperature between about 500.degree. to 800.degree. C., to a thickness between about 1000 to 3000 angstroms.

10. A method according to claim 1, wherein said spacer comprises silicon oxide, using either LPCVD or PECVD procedures, and etching back, to a thickness about 1000 angstroms.

11. A method according to claim 1, wherein said second polysilicon layer is etched, using reactive ion etch (RIE) procedures with $Cl_2$ as a etchant.

12. A method according to claim 1, wherein said bottom electrode has a thickness between about 500 angstroms to several thousand angstroms.

13. A method according to claim 1, wherein said thin dielectric layer comprises a NO (silicon nitride-silicon oxide) layer.

14. A method of fabricating a node capacitor for a dynamic random access memory (DRAM) cell, on a semiconductor substrate, said node capacitor comprising:

forming a first interpoly dielectric (IPD1) layer over said semiconductor substrate;

forming a first photoresist layer on said first interpoly dielectric layer, said first photoresist layer defining a trench;

removing a portion of said first interpoly dielectric layer using said first photoresist layer as a mask, thereby forming said trench in said first interpoly dielectric layer;

removing said first photoresist layer;

depositing a first polysilicon layer on said first interpoly dielectric layer, said first polysilicon layer filling said trench in said first interpoly dielectric layer;

etching said first polysilicon layer to expose said first interpoly dielectric layer;

forming a landing pad over said semiconductor substrate;

depositing a polycide layer on said first interpoly layer and said landing pad;

depositing a second interpoly dielectric (IPD2) layer on said polycide layer;

forming a second photoresist layer on said second interpoly dielectric layer, said second photoresist layer defining a bit line structure;

removing a portion of said second interpoly dielectric layer and a portion of said polycide layer using said second photoresist layer as a mask, thereby forming said bit line structure on said first interpoly dielectric layer;

removing said second photoresist layer;

forming a spacer on said bit line structure;

depositing a second polysilicon layer on said first interpoly dielectric layer, said spacer, and said bit line structure;

forming a third photoresist layer on said second polysilicon layer, said third photoresist layer defining a bottom electrode;

removing a portion of said second polysilicon layer using said third photoresist layer as a mask, thereby forming said bottom electrode;

removing said third photoresist layer;

forming a hemispherical grain (HSG) polysilicon layer on said bottom electrode;

forming a thin dielectric layer on said hemispherical grain polysilicon layer; and depositing a third polysilicon layer to form a top electrode, completely covering said thin dielectric layer.

15. A method according to claim 14, wherein said semiconductor substrate comprises a metal-oxide-semiconductor field effect transistor (MOSFET) formed in and on the substrate, said metal-oxide-semiconductor field effect transistor being a part of said dynamic random access memory cell.

16. A method according to claim 14, wherein said first interpoly dielectric (IPD1) layer comprises a first silicon oxide, using low pressure chemical vapor deposition (LPCVD) procedures and tetraethylorthosilicate (TEOS) as a source, at a temperature between about 500.degree. to 800.degree. C., to a thickness between about 1000 to 3000 angstroms, over said semiconductor substrate.

17. A method according to claim 14, wherein said first interpoly dielectric layer is removed using reactive ion etching (RIE) with CF.sub.4 as an etchant.

18. A method according to claim 14, wherein said first polysilicon layer is deposited, using LPCVD procedures at a temperature between about 600.degree. to 650.degree. C.

19. A method according to claim 14, wherein said landing pad is formed using chemical mechanical polishing (CMP) to etch back said first polysilicon layer.

20. A method according to claim 14, wherein said landing pad is formed using RIE procedures to etch back said first polysilicon layer.

21. A method according to claim 14, wherein said polycide layer comprises polysilicon and tungsten silicon (WSi.sub.2).

22. A method according to claim 14, wherein said second interpoly dielectric (IPD2) layer comprises a second silicon oxide, using LPCVD procedures and TEOS as a source, at a temperature between about 500.degree. to 800.degree. C., to a thickness between about 1000 to 3000 angstroms.

23. A method according to claim 14, wherein said spacer comprises silicon oxide, using either LPCVD or PECVD procedures, and etching back, to a thickness between about 1000 angstroms.

24. A method according to claim 14, wherein said second polysilicon layer is etched, using reactive ion etch (RIE) procedures with Cl.sub.2 as a etchant.

25. A method according to claim 14, wherein said bottom electrode has a thickness between about 500 angstroms to several thousand angstroms.

26. A method according to claim 14, wherein said thin dielectric layer comprises a NO (silicon nitride-silicon oxide) layer.

* * * * *